(12) United States Patent
Macphail

(10) Patent No.: US 6,995,580 B2
(45) Date of Patent: Feb. 7, 2006

(54) POWER DETECTORS FOR MEASURING POWER COUPLING

(75) Inventor: Phil Macphail, Cambridge (GB)

(73) Assignee: SiGe Semiconductor Inc., Ottawa (CA)

( * ) Notice: Subject to any disclaimer, the term of this patent is extended or adjusted under 35 U.S.C. 154(b) by 36 days.

(21) Appl. No.: 10/390,927

(22) Filed: Mar. 19, 2003

(65) Prior Publication Data
US 2004/0183521 A1    Sep. 23, 2004

(51) Int. Cl.
*G01R 31/02*    (2006.01)
(52) U.S. Cl. ...................... 324/763; 324/126
(58) Field of Classification Search ............ 324/117 H, 324/126, 763
See application file for complete search history.

(56) References Cited

U.S. PATENT DOCUMENTS 4,209,759 A    6/1980  Volluet
4,427,936 A *  1/1984  Riblet et al. ................ 324/638
4,998,061 A *  3/1991  Voisine et al. .............. 324/142
5,041,761 A *  8/1991  Wright et al. ............... 315/129
5,570,034 A * 10/1996  Needham et al. ........... 324/763

FOREIGN PATENT DOCUMENTS

WO    WO 01/65267 A1    9/2001

* cited by examiner

*Primary Examiner*—Vinh Nguyen
*Assistant Examiner*—Russell M. Kobert
(74) *Attorney, Agent, or Firm*—Kenyon & Kenyon

(57) ABSTRACT

A power detector for measuring the power transfer between a circuit for emitting an electrical signal and a first conductor that receives the emitted electrical signal. The emitted signal causes a magnetic field to be generated in the first conductor. A coupling detection circuit measures an electric current that arises in a second conductor that is proximate and electrically coupled to the first conductor. The measured electric current in the second conductor is used to determine the power transfer between the emitting circuit and the first conductor. The first and second conductors can be bond wires within an integrated circuit package, and the coupling detection circuit can be disposed in a semiconductor substrate within the integrated circuit package.

22 Claims, 4 Drawing Sheets

Even mode

Odd mode

PROVIDING AN ELECTRICAL SIGNAL WITHIN A CONDUCTOR TO DRIVE A FIRST LOAD, THE ELECTRICAL SIGNAL HAVING A POWER

MAGNETICALLY COUPLING A RADIATED PORTION OF THE ELECTRICAL SIGNAL TO A SECOND OTHER CONDUCTOR, THE SECOND OTHER CONDUCTOR OTHER THAN FORMING PART OF THE FIRST LOAD

PROVIDING THE MAGNETICALLY COUPLED SIGNAL TO A DETECTOR FOR MEASURING THEREOF

DETERMINING POWER TRANSFER BETWEEN THE CIRCUIT AND THE FIRST LOAD IN DEPENDENCE UPON THE MEASURED MAGNETICALLY COUPLED SIGNAL

VARYING THE POWER OF THE PROVIDED ELECTRICAL SIGNAL IN DEPENDENCE UPON THE DETERMINED POWER TRANSFER BETWEEN THE CIRCUIT AND THE FIRST LOAD

Figure 4b

POWER DETECTORS FOR MEASURING POWER COUPLING

FIELD OF THE INVENTION

This invention relates to the area of measuring of power coupling and more specifically to the area of measuring power coupling between a circuit and a load using induced current flow.

BACKGROUND OF THE INVENTION

Power amplifiers (PAs) are used to amplify an input signal prior to providing an amplified output signal to a load. For instance, PAs are used for RF applications, where the PAs are typically coupled to an antenna arrangement. In other cases, PAs are for example used for delivering the amplified signal to a speaker.

In delivering power from the PA to a load coupled thereto, an impedance match between the PA, coupling circuit and the load is important in order to facilitate maximum power transfer therebetween. Transferring less then the maximum power results in unnecessary energy consumption by the PA, since this extra energy not transferred is lost. For instance, when antennas are coupled to PAs, then proper impedance matching is preferable because maximum power transfer occurs therebetween.

A Voltage Standing Wave Ratio (VSWR) is used for antenna systems to measure the coupling efficiency between the PA and the antenna arrangement. Typically, most antennas are not directly connected to the PAs. The antenna is usually located some distance from the transmitter, in the form of a PA, and requires a feedline, in the form of a coupling circuit, to transfer power therebetween. If the feedline has no loss, and is impedance matched to both the PA output impedance and the antenna input impedance, then maximum power is delivered to the antenna. In this case the VSWR is 1:1 and the voltage and current are constant over the whole length of the feedline. Any deviation from this situation causes a "standing wave" of voltage and current to exist on the feedline therebetween. This standing wave results in energy used for driving the PA to be wasted and thus leads to system inefficiencies.

Measuring of the VSWR is typically performed using voltage detectors disposed within the PA. Unfortunately, voltage detectors do not take into account load mismatching between the power amplifier and a device coupled thereto. Therefore, coupling values obtained using the voltage detectors may not be representative of actual coupling therebetween. As a result, reliable values for the VSWR may not be provided.

A need therefore exists for a way of measuring power coupling between a PA and a load that uses other than voltage detectors. It is therefore an object of the invention to provide a method of measuring power coupling between a circuit for emitting an electrical signal and a load coupled thereto by using induced current flow.

SUMMARY OF THE INVENTION

In accordance with the invention there is provided a power detector for measuring power transfer between a circuit for emitting an electrical signal and a first load for receiving the electrical signal comprising: a first conductor for having a magnetic field generated thereabout in response to propagation of the electrical signal therein; a second conductor disposed in proximity of the first conductor, the first and the second conductors disposed having a coupling length therebetween; and, a coupling detection circuit electrically coupled to the second conductor, the coupling detection circuit for receiving an electric current representative of power transfer between the circuit and the first load induced to flow in the second conductor in response to the coupled magnetic field and for measuring power transfer between the circuit for emitting an electrical signal and the first load.

In accordance with the invention there is provided a power detector for measuring power transfer between a circuit for emitting an electrical signal and a first load for receiving the electrical signal comprising: a first conductor coupled to a first output port of the circuit; a second conductor coupled to a second output port of the circuit, the first and second conductors for each having a magnetic field generated thereabout in response to propagation of the electrical signal therein; a third conductor disposed in proximity of the first conductor; a fourth conductor disposed in proximity of the second conductor, the third and fourth conductors disposed each having a coupling length therebetween; and, a coupling detection circuit having first and second input ports electrically coupled to the third and fourth conductors, respectively, the coupling detection circuit for receiving an electric current in each conductor coupled thereto, the electric current representative of power transfer between the circuit and the first load induced to flow in the third and fourth conductors in response to the coupled magnetic field and for measuring power transfer between the circuit for emitting an electrical signal and the first load.

In accordance with the invention there is provided a method of measuring power transfer between a circuit for emitting an electrical signal and a first load for receiving the electrical signal comprising the steps of: providing the electrical signal within a conductor to drive the first load; magnetically coupling a radiated portion of the electrical signal to a second other conductor, the second other conductor other than forming part of the first load; providing the magnetically coupled signal to a detector for measuring thereof; and, determining power transfer between the circuit and the first load in dependence upon the measured magnetically coupled signal.

BRIEF DESCRIPTION OF THE DRAWINGS

The invention will now be described with reference to the drawings in which:

FIG. 4b outlines operating steps in accordance with embodiments of the invention shown in FIGS. 4a, 5 and 6;

DETAILED DESCRIPTION OF THE INVENTION

When two transmission lines are close enough together, then it is possible to couple power between the transmission lines. The coupling of power is a result of interactions between electromagnetic fields from each transmission line. To those of skill in the art it is known that power can be coupled between microstrip lines, as is disclosed in the reference found at Bilkent University, Department of Electrical and Electronics Engineering, in the microwave problems and tutorials section, within the EM applications section, entitled "Directional Coupler Design & Analysis," incorporated herein by reference.

Figure 1:
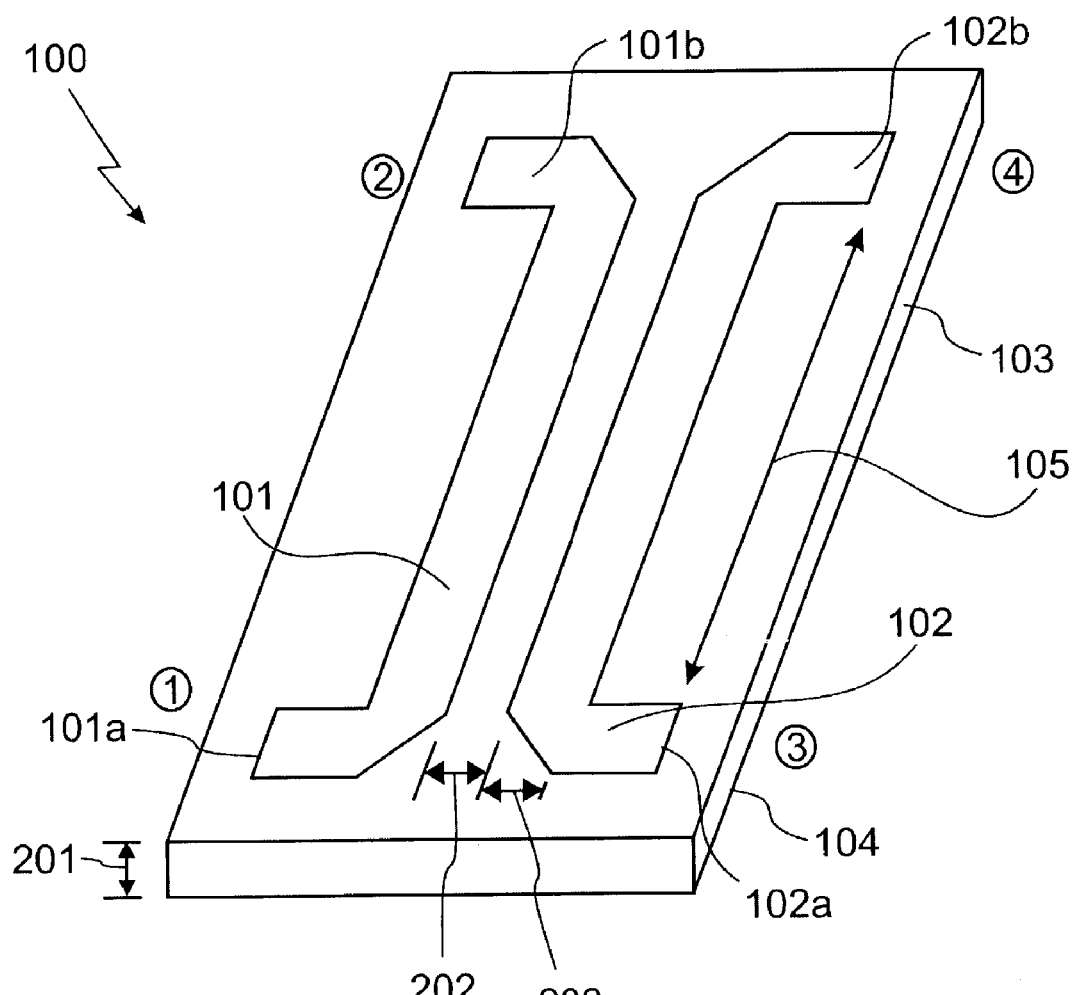
FIG. 1 illustrates a prior art microstrip parallel line coupler in the form of first and second parallel microstrip lines and disposed on a same substrate.

Referring to prior art FIG. 1, a microstrip parallel line coupler 100 is shown, in the form of first and second parallel microstrip lines 101 and 102 disposed on a same substrate 103 having a ground plate thereunder. The first microstrip line 101 has a first input port 101a and a first output port 101b and the second microstrip line 102 has a second input port 102a and a second output port 102b. The first and second parallel microstrip lines have a coupling region therebetween, designated as 105.

Figure 3A:
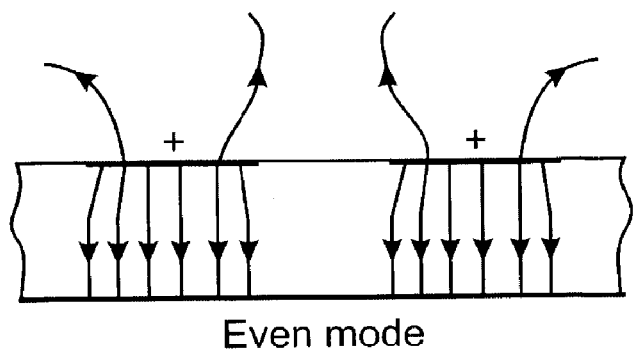
FIG. 3a illustrates even mode propagation in the prior art microstrip parallel line coupler.
Figure 3B:
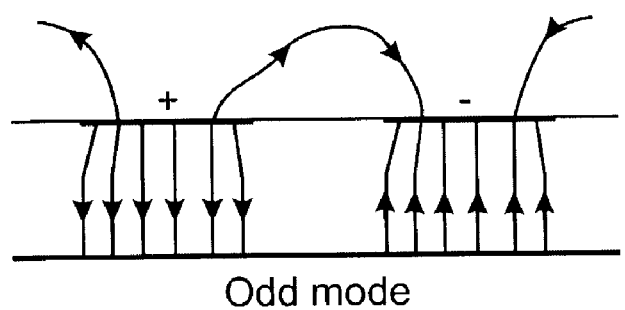
FIG. 3b illustrates odd mode propagation in the prior art microstrip parallel line coupler.

To those of skill in the art it is known that microstrip transmission lines do not support quasi transverse electric modes (TEM) of operation. Furthermore, those of skill in the art appreciate that parallel line couplers have both odd and even modes of operation. The odd and even modes provide the microstrip parallel line coupler 100 with an even mode impedance ($Z_{oe}$) and an odd mode impedance ($Z_{oo}$). Additionally, each microstrip line has a microstrip line impedance ($Z_o$). Odd and even modes for the microstrip parallel line coupler 100 are shown in prior art FIGS. 3a and 3b, respectively.

Figure 2:
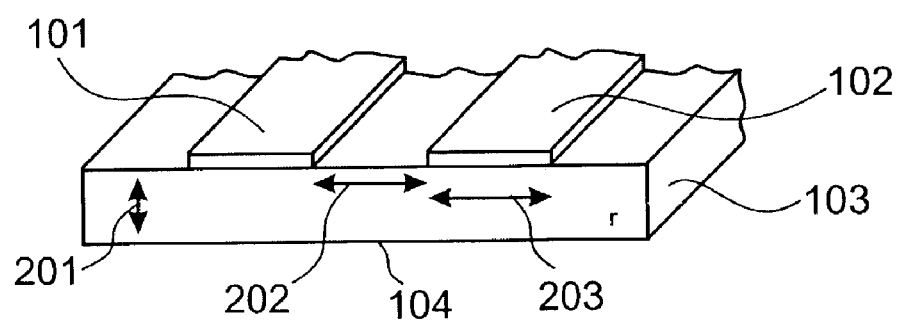
FIG. 2 illustrates a cross-sectional view of the prior art microstrip parallel line coupler.

A cross-sectional view of the prior art microstrip parallel line coupler 100 is shown in prior art FIG. 2. In terms of analyzing the operation of the coupler shown in prior art FIG. 1, the following design parameters are important: a width of each microstrip line (w) 203, a height of the substrate (h) 201, and a separation between the microstrip lines (s) 202. Furthermore, other parameters that are of importance are the relative dielectric constant of the substrate ($\epsilon_r$) and the effective permittivity ($\epsilon_{eff}$), as well as coupling (C) between the parallel microstrip lines. From the aforementioned parameters, a shape ratio w/h and a spacing ratio s/h are determined for coupling between the parallel microstrip lines 101 and 102.

Of course, the shape ratios only deal with the cross-sectional parameters of the microstrip parallel line coupler 100. However, as is seen in prior art FIG. 1, microstrip parallel line coupler 100 also has another parameter, length. In determining an optimum length of the microstrip parallel line coupler 100, a predetermined design frequency is chosen and the length is determined accordingly using this design frequency. In this case, for the purposes of improved coupling between microstrip lines, a length of λ/4 is chosen.

Power detectors that are currently implemented on power amplifiers are essentially voltage detectors. Unfortunately, voltage detectors do not take into account load mismatching between the power amplifier and a device coupled thereto. Thus, a variation of the microstrip parallel line coupler 100 is used to facilitate more accurate measuring of power coupling. An example of this variation is shown in FIG. 4a as an embodiment of the invention.

Figure 4A:
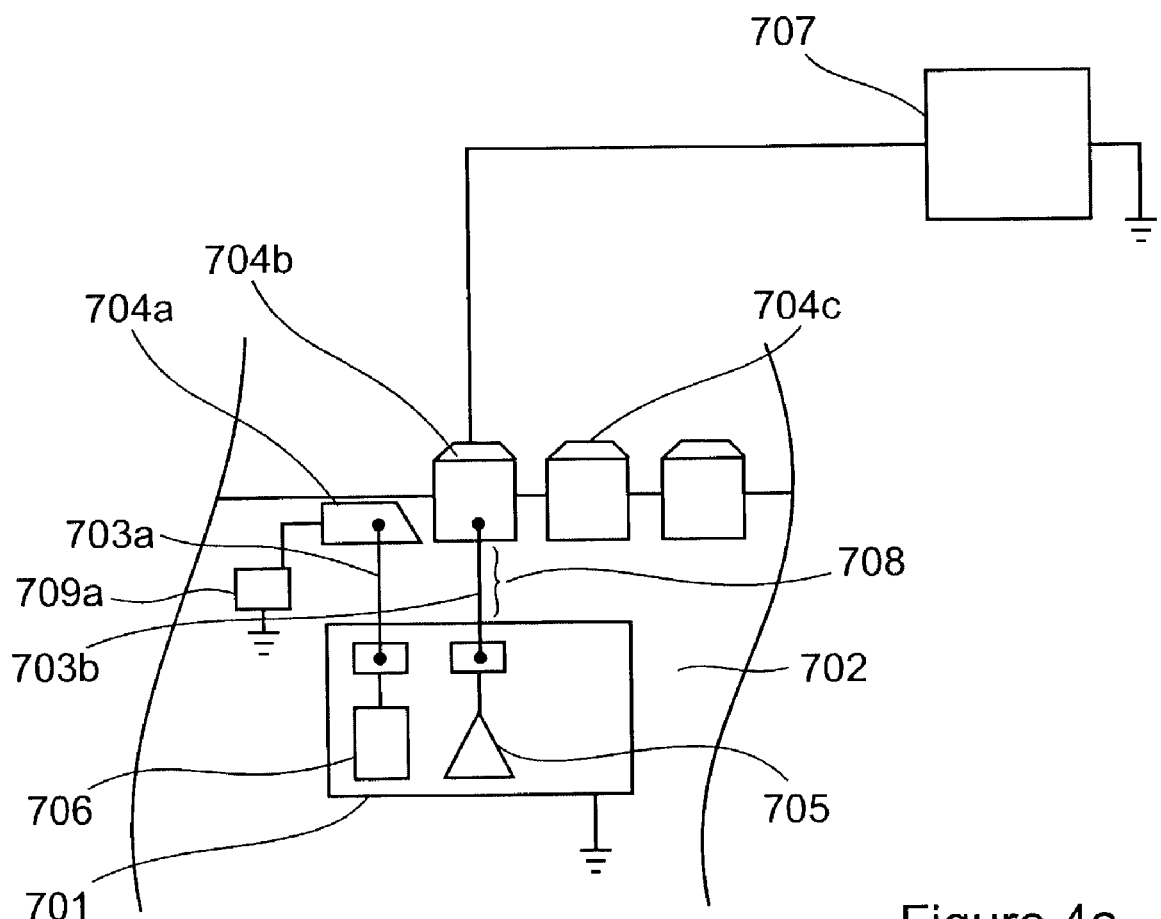
FIG. 4a illustrates an embodiment of the invention, a dual bond-wire power coupler.

Referring to FIG. 4a, a semiconductor die 701 disposed within a semiconductor package 702 is illustrated. Bonding wires 703a through 703b are provided for connecting ports disposed on the semiconductor die to pins 704a through 704c at an outside thereof. Disposed within the semiconductor die 701 are an amplifier circuit 705 and a coupling detection circuit (CDC) 706. The amplifier circuit output port is connected to the bond wire 703b. Bond wires 703a is in proximity of bond wire 703b and preferably adjacent and preferably substantially parallel thereto. Of course, pin 704a is preferably of such a design that it does not penetrate the semiconductor package, but serve as a terminating point for the bond wire and is connected to an impedance ($Z_o$) 709a.

Referring to FIG. 4b, method steps are outlined detecting induced current flow in an electrical conductor in accordance with an embodiment of the invention. As electrical energy flows from the amplifier 705 through bond wire 703b, a magnetic field is induced about the bond wire in response to electrons flowing through the bond wire 703b. Because bond wire 703a is in close enough proximity to bond wire 703b, an electric field is induced to flow in this adjacent bond wire 703a. The CDC 706 detects this electric current and a determination is made as to an amount of electrical energy flowing through bond wire 703b. A coupling length 708 between the bond wires 703a and 703b determines an amount of energy coupling therebetween. Preferably, along this coupling length 708 the bond wires are sufficiently close and sufficiently parallel to facilitate coupling of energy therebetween.

Of course, those skilled in the art appreciate that if a power amplifier, such as amplifier 705, is misterminated at the output port thereof, a standing wave is generated between the amplifier output port and an input port of a device 707 coupled thereto. Having proper termination results in maximum power transfer between the amplifier 705 and the device 707 coupled thereto. Typically, if the power amplifier output port is misterminated, then an impedance of the input port of the device 707 and coupling circuit, coupling the device 707 to the amplifier output port, does not match the impedance of the amplifier output port. This impedance mismatch results in improper power transfer from the amplifier to the device 707. This results in a standing wave to be generated along bond wire 703b. This standing wave causes electrical energy to be induced in bond wire 703a through electromagnetic coupling occurring mostly along the coupling length 708 therebetween. An amount of electrical energy flowing in this bond wire 703a is related to the amount of impedance mismatch between the amplifier circuit output port and the device 707. Thus, the higher the impedance mismatch between the amplifier output port and the input port of the device, the more electrical energy is provided to the CDC 706. Conversely, having properly terminated coupling between the circuit 705 and the device 707 results in a minimal amount of electrical energy to be detected by the CDC 706.

Detecting the magnetic field about the bond wire that delivers the signal to the device coupled thereto advantageously allows for monitoring of the radiated power. Of course, the more power that is radiated by bond wire 704b, the less efficient the power transfer between the amplifier and device coupled thereto. Sensing of output voltage between the power amplifier and device coupled thereto is unfortunately not representative of the power transfer occurring therebetween, thus measuring of radiated power advantageously allows for more accurate measurements of power coupling.

Figure 5:
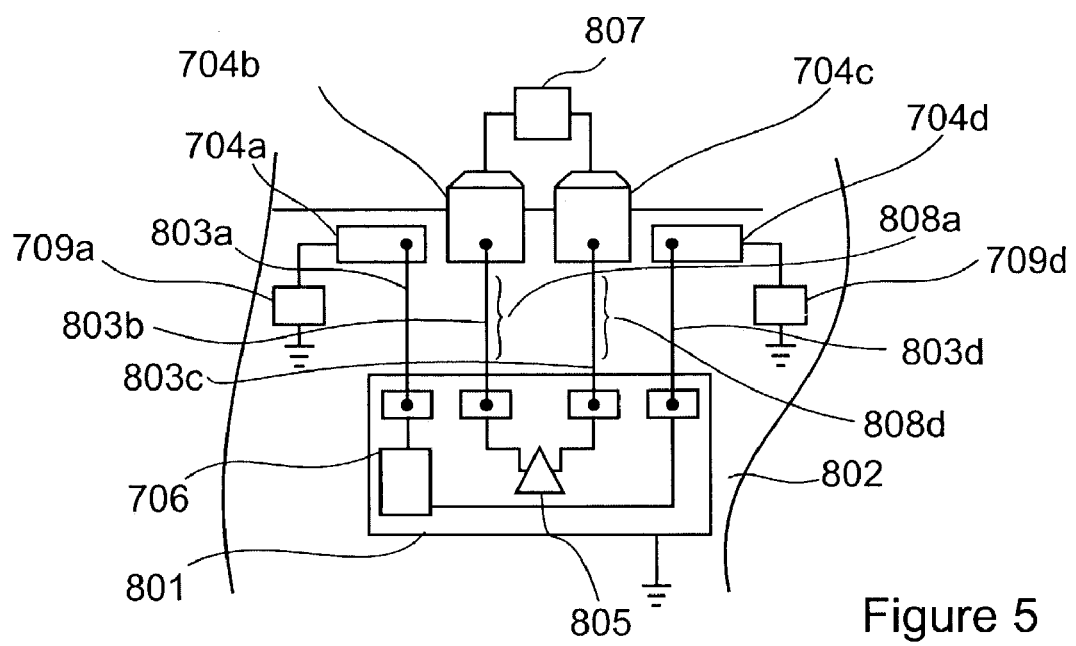
FIG. 5 illustrates another embodiment of the invention, a four bond-wire power coupler; and, FIG. 6 illustrates yet another embodiment of the invention, a four circuit trace PCB power coupler.

In FIG. 5 a variation of the embodiment shown in FIG. 4a is illustrated. In this case, a semiconductor die 801 disposed within a semiconductor package 802. Bonding wires 803a through 803d are provided for connecting ports disposed on the semiconductor die 801 to pins 704a through 704d at an outside thereof. Disposed within the semiconductor die 801 are an amplifier circuit 805 having two output ports and a coupling detection circuit (CDC) 706. Each of the amplifier circuit 805 output ports is connected to a respective bond wire 803b and 803c. Bond wire 803a is in proximity to bond wire 803b and preferably adjacent and preferably substantially parallel thereto. Bond wire 803d is in proximity to bond wire 803c and preferably adjacent and substantially parallel thereto. Of course, pins 704a and 704d are preferably of such a design that they do not penetrate the semiconductor package, but serve as a terminating point for their respective bond wire, with each terminated to a respective impedance 709a and 709d. As electrical energy flows from the amplifier 805 through bond wires 803b and 803c, a magnetic field is induced about each of the bond wire in response to electrons flowing therethrough. Because bond wires 803a and 803d are in proximity to bond wires 803b and 803c, an electric field is induced to flow in these adjacent bond wires 803a and 803d. The electric field is induced along a coupling length 808a and 808d, where preferably the bond wires are substantially parallel along this length and are sufficiently close to facilitate partial energy transfer therebetween. The CDC 706 detects this induced electric current and a determination is made as to an amount of radiated electrical energy that is lost in the coupling between the amplifier circuit and the device coupled thereto. The more electrical energy that is detected by the CDC, meaning the more energy that is radiated, the worse the coupling between the circuit 706 and the device 807 and as a result, the worse the power transfer therebetween.

Figure 6:
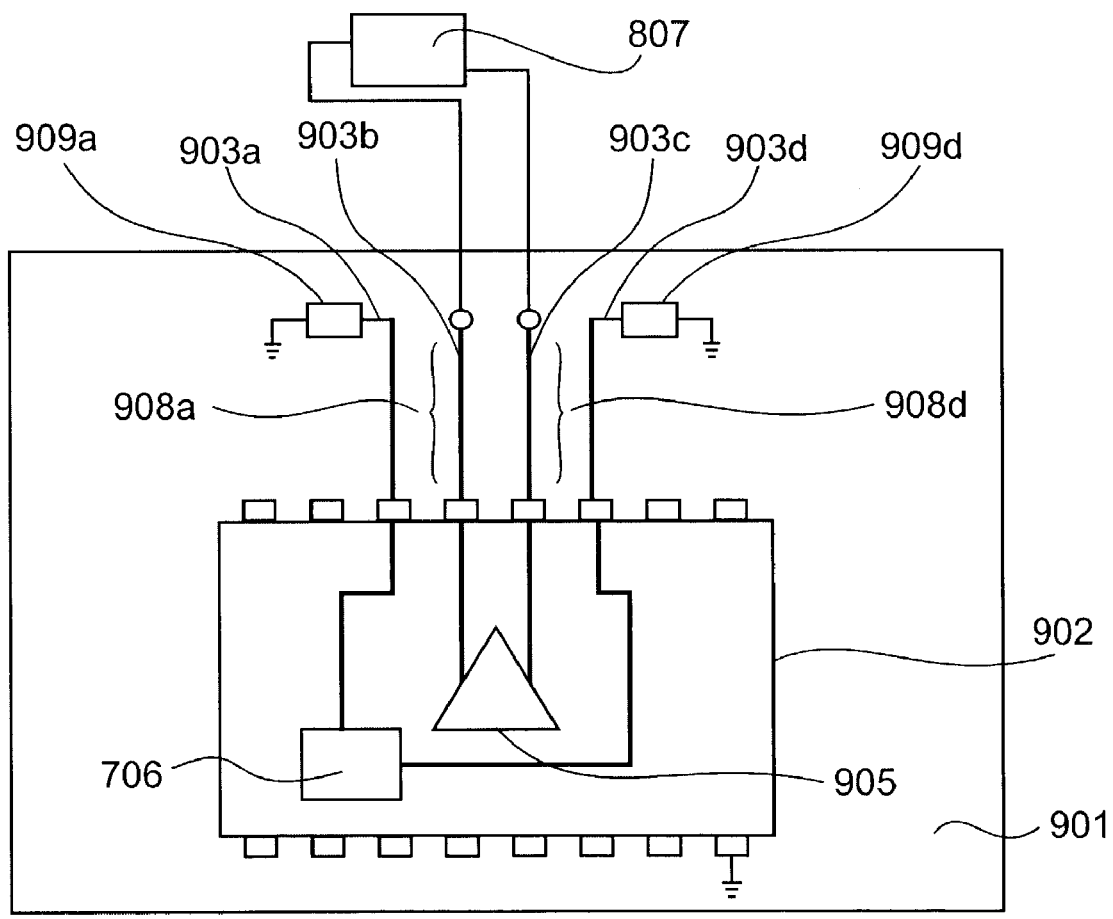

In FIG. 6, a further variation of the embodiment of the invention is shown. In this case a circuit board 901 is provided with dual circuit traces 903b and 903c electrically coupled to output ports of an amplifier circuit 905 disposed within an integrated circuit 902. Two additional circuit traces 903a and 903d are in proximity thereof and preferably adjacent to each of the dual circuit traces 903b and 903c, respectively. The additional circuit traces 903a and 903d are coupled to an on-chip CDC 706 at an end thereof, and at an opposite end thereof are coupled to a respective impedance 909a and 909d. The dual circuit traces 903b and 903c are further electrically coupled to a device 807 that acts as a load.

The two additional circuit traces 903a and 903d are preferably substantially parallel to traces 903b and 903c and sufficiently close thereto and have a sufficient coupling length 908a and 908d therebetween to facilitate coupling of radiated energy induced by traces 903b and 903c. Thus, when the impedance of the amplifier circuit output ports does not match the input impedance of the device, then maximum power transfer does not occur therebetween and electrical energy is induced in traces 903a and 903d. The CDC is coupled to traces 903a and 903d using pins disposed on the chip 902. Having the CDC within the same chip as an amplifier circuit facilitates the determining of whether maximum power transfer is occurring between the amplifier circuit and the device. This advantageously allows for active monitoring of the power transfer between the amplifier and the device and allows for performance of the amplifier circuit to be modified, in response to the CDC, in order to facilitate improved power transfer therebetween.

Advantageously, packaging of the semiconductor die is repeatable in those embodiments shown in FIGS. 7 and 8, thus the power coupler performance is repeatable too. Of course, it may be preferable to calibrated the CDC for each different packaged semiconductor die to ensure that readings derived from the CDC are deterministic of the actual power coupling between the amplifier circuit and the device.

Preferably, the bond wire lengths 703a through 703c and 803a through 803d are approximately 1 mm in length, however this length is not that important. Of course, the length of the bond wires determines an amount of coupling therebetween. Typically, a signal level provided to the CDC from the bond wires is around 30 dB smaller than an amplified signal emitted from output ports of the amplifier circuit.

Of course, the CDC is used to determine power coupling between the circuit and the device. The manner in which the coupling is reported by the CDC is not of importance. In some cases if maybe preferable to have the CDC configured to provide VSWR measurements. Of course, other indications of power coupling may be preferable.

Advantageously, the embodiments of the invention provide for a device that is manufactured in such a manner that power sensors are integrated therein without significantly increasing the size of the semiconductor die and its cost.

Numerous other embodiments may be envisaged without departing from the spirit or scope of the invention.

What is claimed is:

1. A power detector for measuring power transfer between a circuit for emitting an electrical signal and a first load for receiving the electrical signal comprising:
   a first conductor for having a magnetic field generated thereabout in response to propagation of the electrical signal therein;
   a second conductor other than disposed in series with the first conductor and disposed in proximity of the first conductor, the first and the second conductors disposed having a first coupling length therebetween; and,
   a coupling detection circuit electrically coupled to the second conductor, the coupling detection circuit for receiving an electric current representative of power transfer between the circuit and the first load induced to flow in the second conductor in response to the coupled magnetic field between the first conductor and the second conductor and for measuring power transfer between the circuit for emitting an electrical signal and the first load,
wherein the first conductor is a first bond wire and the second conductor is a second bond wire, the bond wires disposed within an integrated circuit package and wherein the coupling detection circuit resides within a semiconductor substrate within the integrated circuit package.

2. A power detector according to claim 1, wherein the circuit for emitting the electrical signal is disposed within the same semiconductor substrate as the coupling detection circuit.

3. A power detector according to claim 1, wherein the first conductor and the second conductor are substantially parallel along the first coupling length therebetween.

4. A power detector according to claim 3, wherein a capacitive coupling is formed between the first conductor and the second conductor along the first coupling length therebetween.

5. A power detector according to claim 4, wherein the circuit for emitting the electrical signal is disposed within the same semiconductor substrate as the coupling detection circuit.

6. A power detector according to claim 4, wherein the first coupling length is approximately 1 mm in length.

7. A power detector according to claim 4, wherein the first conductor and the second conductor each comprise an electrically conducting trace on a printed circuit board (PCB).

8. A power detector according to claim 4, wherein the circuit for emitting the electrical signal comprises an amplifier circuit.

9. A power detector according to claim 4, wherein the second conductor is terminated with a predetermined impedance at an end thereof opposite to an end coupled to the coupling detection circuit.

10. A power detector according to claim 1 comprising:
wherein the first conductor is coupled to a first output port of the circuit;
a third conductor coupled to a second output port of the circuit, the third conductor for having a magnetic field generated thereabout in response to propagation of the electrical signal therein;
a fourth conductor disposed in proximity of the third conductor, the fourth conductor disposed adjacent the third conductor and having a second coupling length therebetween; and,
wherein the coupling detection circuit is electrically coupled to the fourth conductor, the coupling detection circuit for receiving an electric current in each conductor coupled thereto, the electric current representative of power transfer between the circuit and the first load induced to flow in the second and fourth conductors in response to the coupled magnetic field and for measuring power transfer between the circuit for emitting an electrical signal and the first load.

11. A power detector according to claim 10, wherein the third conductor is a third bond wire and the fourth conductor is a fourth bond wire, the bond wires disposed within an integrated circuit package and wherein the coupling detection circuit resides within a semiconductor substrate within the integrated circuit package.

12. A power detector according to claim 11, wherein the circuit for emitting the electrical signal is disposed within the same semiconductor substrate as the coupling detection circuit.

13. A power detector according to claim 10, wherein the second coupling length is approximately 1 mm in length.

14. A power detector according to claim 10, wherein the second coupling length is substantially parallel between the adjacent pairs conductors.

15. A power detector according to claim 10, wherein each of the conductors comprise an electrically conducting trace on a printed circuit board (PCB).

16. A power detector according to claim 10, wherein the circuit for emitting the electrical signal comprises an amplifier circuit.

17. A power detector according to claim 10, wherein the second conductor is terminated with a first predetermined impedance at an end thereof opposite to an end coupled to the coupling detection circuit and the fourth conductor is terminated with a second predetermined impedance at an end thereof opposite to an end coupled to the coupling detection circuit.

18. A power detector according to claim 10, wherein the electric current induced to flow within each of the second conductor and the fourth conductor is induced to flow therein by capacitive coupling of the second conductor with the first conductor and of the fourth conductor with the third conductor.

19. A power detector according to claim 1, wherein the first coupling length is approximately 1 mm in length.

20. A power detector according to claim 1, wherein the first conductor and the second conductor each comprise an electrically conducting trace on a printed circuit board (PCB).

21. A power detector according to claim 1, wherein the circuit for emitting the electrical signal comprises an amplifier circuit.

22. A power detector according to claim 1, wherein the second conductor is terminated with a predetermined impedance at an end thereof opposite to an end coupled to the coupling detection circuit.

* * * * *